United States Patent [19]
Yamada

[11] Patent Number: 4,763,302
[45] Date of Patent: Aug. 9, 1988

[54] ALTERNATIVELY ADDRESSED SEMICONDUCTOR MEMORY ARRAY

[75] Inventor: Tatsuo Yamada, Hyogo, Japan

[73] Assignee: Mitsubishi Denki Kabushiki Kaisha, Tokyo, Japan

[21] Appl. No.: 854,639

[22] Filed: Apr. 22, 1986

[30] Foreign Application Priority Data

Jun. 21, 1985 [JP] Japan ................ 60-136539

[51] Int. Cl.⁴ ............................................ G11C 11/40
[52] U.S. Cl. ..................................... 365/189; 365/233
[58] Field of Search ............... 365/189, 191, 202, 210, 365/230, 233

[56] References Cited

U.S. PATENT DOCUMENTS 3,800,289 3/1974 Batcher .
4,056,819 11/1977 Lukas .
4,494,222 1/1985 White et al. .

FOREIGN PATENT DOCUMENTS 0156316 10/1985 European Pat. Off. .

OTHER PUBLICATIONS

"All Points Addressable Raster Display Memory", Richard Matick, et al., IBM J. Res. Develop., vol. 28, No. 4, Jul., 1984, New York, pp. 379-392.

Primary Examiner—Terrell W. Fears
Attorney, Agent, or Firm—Sughrue, Mion, Zinn, Macpeak, and Seas

[57] ABSTRACT

A memory array and associated control circuitry in which the cells of the array can be accessed according to at least two addressing configurations. A multiple-bit bit address can be applied directly to an address decoder or, responsive to control signals, the bits of the address can be rearranged before being applied to the decoder. Additionally, the width of the accessed word can be increased by optionally ignoring some of the address bits but then increasing the number of bits accessed in parallel.

9 Claims, 9 Drawing Sheets

FIG. 1 PRIOR. ART

ALTERNATIVELY ADDRESSED SEMICONDUCTOR MEMORY ARRAY

BACKGROUND OF THE INVENTION

The present invention relates to a semiconductor memory device and, particularly, to a semiconductor memory device in which at least two physical addresses can be assigned to each memory cell thereof by providing for variable address decoding.

Figure 1:
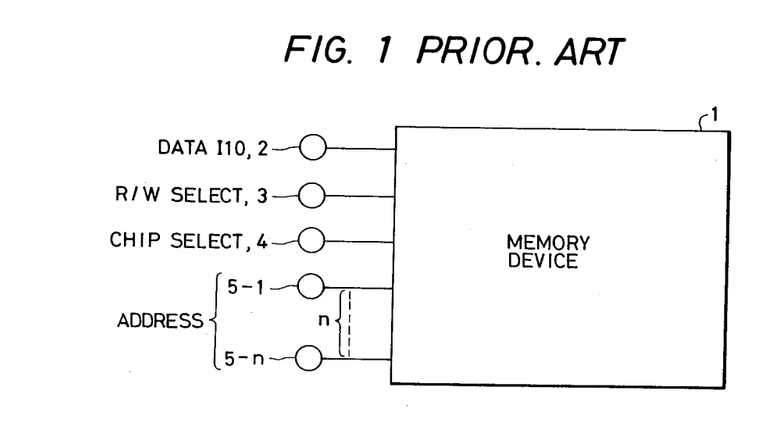
FIG. 1 shows schematically a construction of a conventional semiconductor memory device.

FIG. 1 shows schematically a construction of a conventional semiconductor memory device 1, in the form of a random access memory (RAM) having a common line serving as a data input as well as a data output line between a data input/output terminal 2 and a semiconductor memory. The semiconductor memory device 1 stores data and uses the data input/output terminal 2 for external data transfer. It also includes a read/write (R/W) terminal 3 for receiving an instruction signal to select an operation mode of the memory device, whether a read operation or a write operation. A chip select (CS) terminal 4 receives a chip selection signal to select one of the chips constituting the memory device 1. Address input terminals 5-1-5-n receive signals determining addresses of the memory cells to be accessed.

The address terminal 5-1 is for a 0-th address input bit and the address terminal 5-n is for a (n-1)th address input bit. The total number n of the address input terminals is usually determined such that a total number of internal memory cells of the memory device becomes $2^n$. That is, the number n of the address input terminals can be represented by $n=\log_2 N$ where N is the total number of the internal memory cells.

Figure 2:
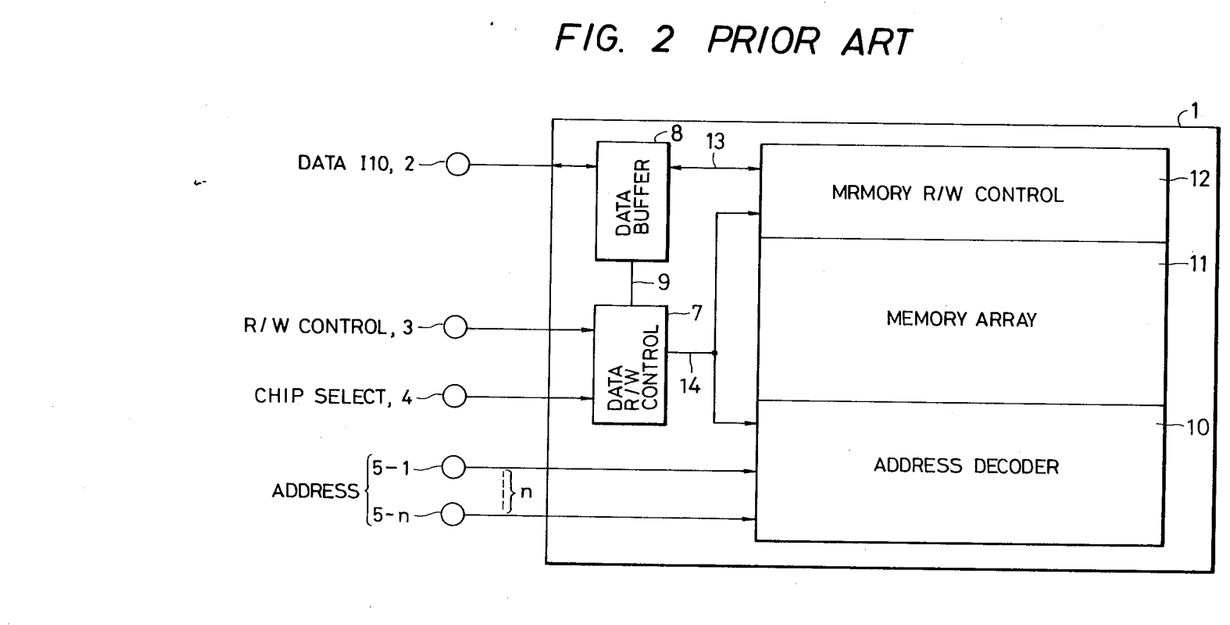
FIG. 2 shows the construction in FIG. 1 in more detail.

FIG. 2 is a block diagram of an example of the semiconductor memory device shown in FIG. 1. In FIG. 2, the semiconductor memory device 1 includes a data read/write (R/W) control circuit 7, a data buffer circuit 8 and an address decoder circuit 10. A memory cell array 11 usually includes $2^n$ memory cells and constitutes a memory circuit of the semiconductor memory device 1. Finally, there is a memory read/write control circuit 12.

The data R/W control circuit 7 receives signals from the R/W select terminal 3 and the chip select terminal 4 and supplies a R/W control signal 14 to both the memory R/W control circuit 12 and the address decoder circuit 10. The data R/W control circuit 7 also supplies a data buffer control signal 9 to the data buffer circuit 8 to thereby control the data R/W operation of the semiconductor device 1.

The data buffer circuit 8 is responsive to the data buffer control signal 9 for controlling a data transfer between the data input/output terminal 2 and the memory R/W control circuit 12.

The address decoder circuit 10 is responsive to R/W control signal 14 for decoding n address signals from the n address input terminals 5-1-5-n and selecting memory cells corresponding to these address signals.

The memory R/W control circuit 12 is responsive to the R/W signal 14 for controlling a data transfer with to or from the memory cells selected according to the address signals.

The data buffer circuit 8 and the memory R/W control circuit 12 are mutually connected through an internal data line 13. The memory R/W control circuit 12 is further supplied with a signal from the address decoder circuit 10 by a connection which is not shown.

The memory R/W control circuit 12 is usually composed of a sense amplifier and an internal data line buffer and the like. The signal for selecting one of the memory cells of the memory cell array 11 is provided by the address decoder circuit 10.

An operation of the semiconductor memory device 1 will be described with reference to FIG. 2 for a data write mode. First, the address of the memory cell in which data is to be written is supplied to the input terminals 5-1-5-n and the chip select terminal 4 is made active to select one or more memory cells. At the same time, data to be written in the memory cell is supplied to the data input/output terminal 2 and a write enable signal is supplied to the R/W terminal 3. The data R/W select control circuit 7 responds to the signals from the chip select terminal 4 and the R/W select terminal 3 to produce the data buffer control signal 9 which is supplied to the data buffer circuit 8. The data buffer circuit 8 responds to the data buffer control signal 9 to transfer the data supplied to the input/output terminal 2 to the internal data line 13. The address decoder circuit 10 decodes the address signals given from the address input terminals 5-1-5-n and selects one of the memory cells of the memory cell array 11 which corresponds to the address determined by the address signals. The memory R/W control circuit 12 responds to the R/W control signal 14 supplied from the data R/W control circuit 7 to write the data on the internal data line 13 into the memory cell selected by the signal (not shown) supplied from the address decoder circuit 10.

When a piece of data is to be read out from the semiconductor memory device 1, an address of a memory cell from which the data is to be read out is supplied to the address input terminals 5-1-5-n the chip select terminal 4 is set active and the R/W select terminal 3 is set to indicate a readout mode. The address decoder circuit 10 decodes the address signal given to the address input terminals 5-1-5-n, in the same manner as in the case of the writing operation, to select one of the memory cells of the memory cell array 11 that corresponds to the supplied address. The memory R/W control circuit 12 responds to the signal from the address decoder circuit 10 and the R/W control signal 14 from the data R/W control circuit 7 to read out a bit of information contained in the selected memory cell and to send it to the internal data line 13. The information sent to the internal data line 13 is transferred to the data input/output terminal 2 through the data buffer circuit 8 which operates in response to the data buffer control signal 9 from the R/W control circuit 7.

In the conventional semiconductor memory device as mentioned above, the determination of a particular memory cell of the memory cell array 11 is performed by the n address signal bits supplied externally to the n address terminals 5-1-5-n. Further, in the conventional memory device, a redundancy circuit is provided to avoid defective portions of the memory cells and the like and to use a memory cell which is physically different from that assigned by the address signal supplied to the address input terminals. Even in such a case, however, a memory cell selected according to a bit of addressing given through the address input terminals to the address line is definitely determined and thus it is impossible to access the same memory cell by sending a different address.

SUMMARY OF THE INVENTION

An object of the present invention is to provide a semiconductor memory device in which a memory cell of a memory cell array can be selected according to either of at least two different addresses that are input depending upon a desired type of data processing.

The semiconductor memory device according to the present invention includes an address conversion instruction signal generator for producing a signal instructing an address conversion. The address conversion instruction signal generator may be incorporated in the memory device or provided externally of the memory device. Address bits supplied externally are converted into a different set of address bits according to the signal from the address conversion instruction signal generator. An assigned memory cell is selected according to the address information which has possibly been converted.

Preferably, the converted address information selects a plurality (l) of memory cells simultaneously. The address conversion instruction signal is also supplied to the memory R/W control circuit which changes a configuration of a data bus from 1 bit to l bits, for example, according to the address conversion instruction signal. The l bits of the data are assigned in parallel to the selected l memory cells for readout or write-in.

DESCRIPTION OF THE PREFERRED EMBODIMENTS

Figure 3:
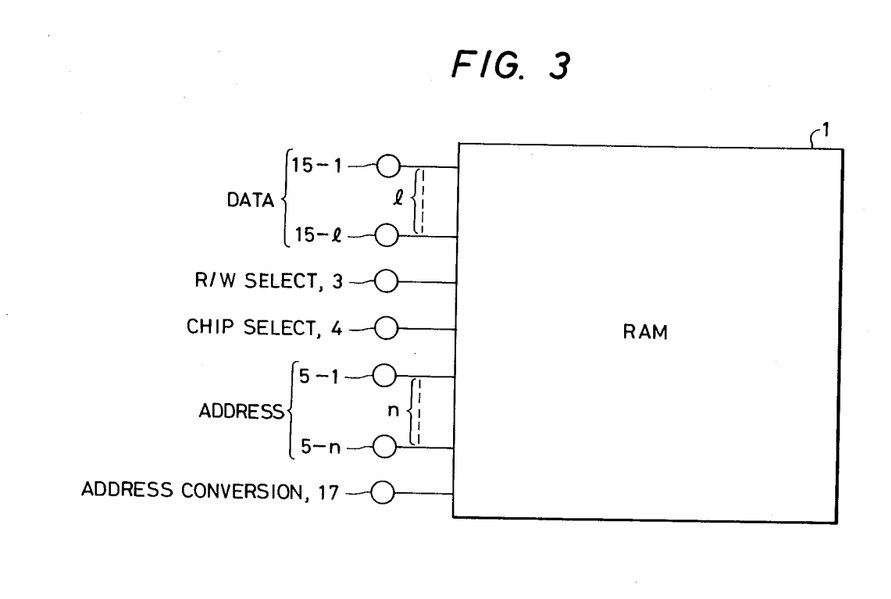
FIG. 3 shows schematically an embodiment of the present invention.

FIG. 3 is a schematic construction of a semiconductor memory device according to an embodiment of the present invention, which is a random access memory (RAM). In FIG. 3, the RAM 1 has a plurality (l) of data input/output terminals 15-1–15-l, a plurality (n) of address input terminals 5-1–5-n and an address conversion instruction terminal 17 for reception of an address conversion instruction signal. It has also a chip select terminal 4 for chip selection and a R/W select terminal 3 for reception of a signal assigning an operation mode, readout or write-in, as in the conventional memory.

Figure 4:
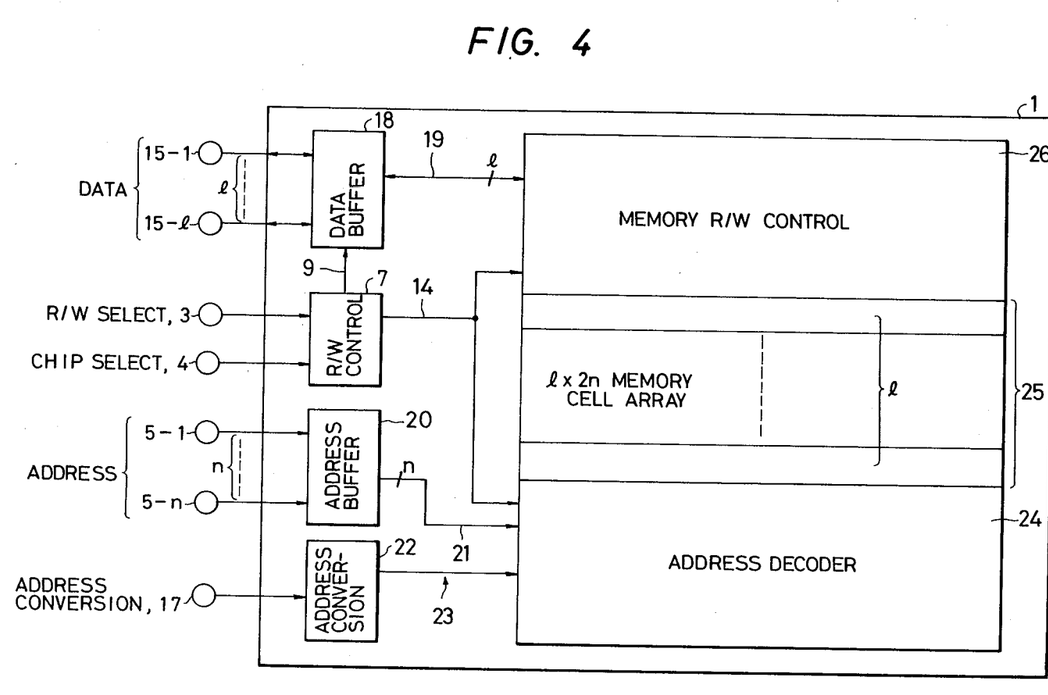
FIG. 4 shows the embodiment in FIG. 3 in more detail.

FIG. 4 is a block circuit diagram of the RAM 1 in FIG. 3, in which an internal data bus 19 is constructed with a plurality (l) of signal lines. As shown in FIG. 4, the RAM 1 comprises a R/W control circuit 7, a data buffer circuit 18, an address decoder circuit 24, a memory cell array 25 and a memory R/W control circuit 26 which are similar as a concept to corresponding elements in the conventional memory device shown in FIG. 2. Additionally, the RAM 1 includes an address conversion control circuit 22 for producing a signal determining whether or not an address conversion is to be performed.

The data buffer circuit 18 operates under the control of a data buffer control signal 9 from the R/W control circuit 7 to control a data transfer between the data input/output terminals 15-1–15-l and the memory R/W control circuit 26. The R/W control circuit 7 responds to the signals supplied to the chip select terminal 4 and the R/W select terminal 3 to produce a R/W control signal 14 which is supplied to the memory R/W control circuit 26 and the address decoder circuit 24. The R/W control circuit 7 further produces the data buffer control signal 9 which is supplied to the data buffer circuit 18.

An address buffer circuit 20 receives address signals from the address input terminals 5-1–5-n and supplies them through the internal address bus 21 to the address decoder circuit 24. The internal address bus 21 is composed of a plurality (n) of signal lines. The address conversion control circuit 22 responds to an address conversion control signal 23 supplied to the address conversion instruction terminal 17, indicative of whether or not the address conversion is to be performed, and sends the latter signal to the address decoder circuit 24. The address decoder circuit 24 responds to the R/W control signal from the R/W control circuit 7 to convert (decode) the address information supplied to it from the address buffer circuit 20 over the internal address bus 21. The conversion or decoding is made according to the address conversion control signal 23 to thereby select a memory cell of the memory cell array 25. The memory cell array 25 includes $l \times 2^n$ memory cells and is divided into memory cell sub-arrays, the number of which is usually equal to the number (l) of the data input/output terminals.

The memory R/W control circuit 26 responds to the R/W control signal 14 to control the readout/write-in operation mode of the memory cell array 25. The memory R/W control circuit 26 is usually composed at a sense amplifier, an internal data line buffer and the like and receives a signal (not shown) from the address decoder circuit 24.

The response of the address decoder circuit 24 depends on the address conversion control signal 23 which is based on the information supplied through the address conversion instruction terminal 17 to the address conversion control circuit 22. Dependent on the address conversion control signal 23, the address decoder circuit 24 produces one of two different address decode signals with respect to the address information from the n address input signal terminals 5-1–5-n. That is, the address decoder circuit 24 produces either first address decode signals in the same order $0, 1, \ldots, 2^{n-1}$ as the n address input bits or second address decode signals in a different order, for instance, $m, m+1, \ldots, 2^{n-1}, 0, 1, \ldots, m-1$ from the order of the n address input bits. In the latter conversion, m is an integer.

Figure 5:
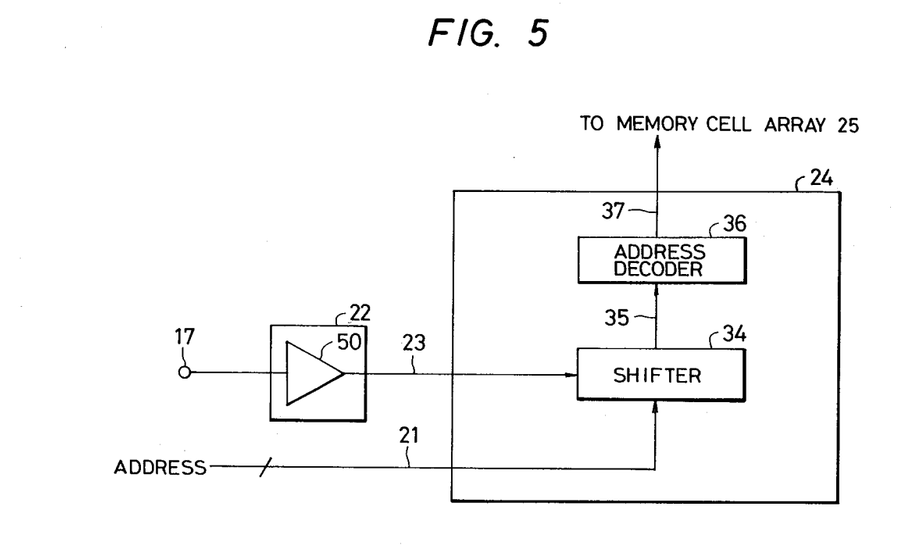
FIG. 5 shows examples of an address conversion control circuit and an address decoder circuit to be used in the embodiment in FIG. 3.

FIG. 5 shows an embodiment for performing the address conversion mentioned above, which includes the address conversion control circuit and the address decoder. In FIG. 5, the address conversion control circuit 22 is composed of a buffer 50. The address decoder circuit 24 is composed of adder 34 and a ROM address decoder 36, implemented in a read-only-memory, which receives an output signal of the adder 34. The adder 34 responds to address signals 21 from the n internal address busses and operates in two different modes to either add m or not to add according to logic level "1" or "0" of the address conversion control signal 23. The value m is a predetermined value with respect to the n address input signals. That is, an address signal on a plurality (n) of the output lines 35 of the adder 34, is converted or not converted according to the address conversion control signal 23. The ROM address decoder 36 responds to the address information from the adder 34 to decode it and to thereby select a memory cell of the memory cell array 25. There are $2^n$ output lines provided between the memory cell array 25 and the ROM address decoder 38.

In operation, the data readout from the memory cell array 25 and the data write-in to the memory cell array are performed with the same way as in the conventional device. However, the address decoding is different from that of the conventional device. The address conversion control circuit 22 provides as the address conversion control signal a value of "1" or "0" according to the "1" or "0" signal supplied to the address conversion instruction terminal 17. The address conversion control signal 23 is then supplied to the adder 34. When the address conversion control signal is "1", an address conversion is performed. The adder 34 responds to the "1" output of the address conversion control circuit to add the predetermined number m. Since the ROM address decoder 36 responds to the outputs on the lines 35 to decode these lines, the address information given to the address input terminals 5-1-5-n are converted by the adder 34, and the ROM address decoder 36 selects a proper memory cells of the each memory cell array 25 according to the converted address information.

When the signal "0" is supplied from the address conversion instruction terminal 17, same address information on the internal address bus 21 appears on the output lines 35 of the adder 34.

Considering any one of the memory cells of the memory cell array 25, the memory cell is capable of having two different addresses either of which is selected according to the information for the address conversion instruction terminal 17. Thus, in this embodiment, the address decode circuit 24 can provide two different addresses for one memory cell. It is arbitrary how to provide such different addresses for the one cell. Further, the number of the address conversion instruction terminals and the number of the address conversion control circuits are both arbitrary.

In the embodiment in FIG. 4, the address conversion control signal 23 from the address conversion control circuit 22 is supplied only to the address decoder circuit 24. However, it is further possible to use the address conversion control signal 23 to change the number of effective lines of a variable-width data bus connected externally to the data input/output terminals.

Figure 6:
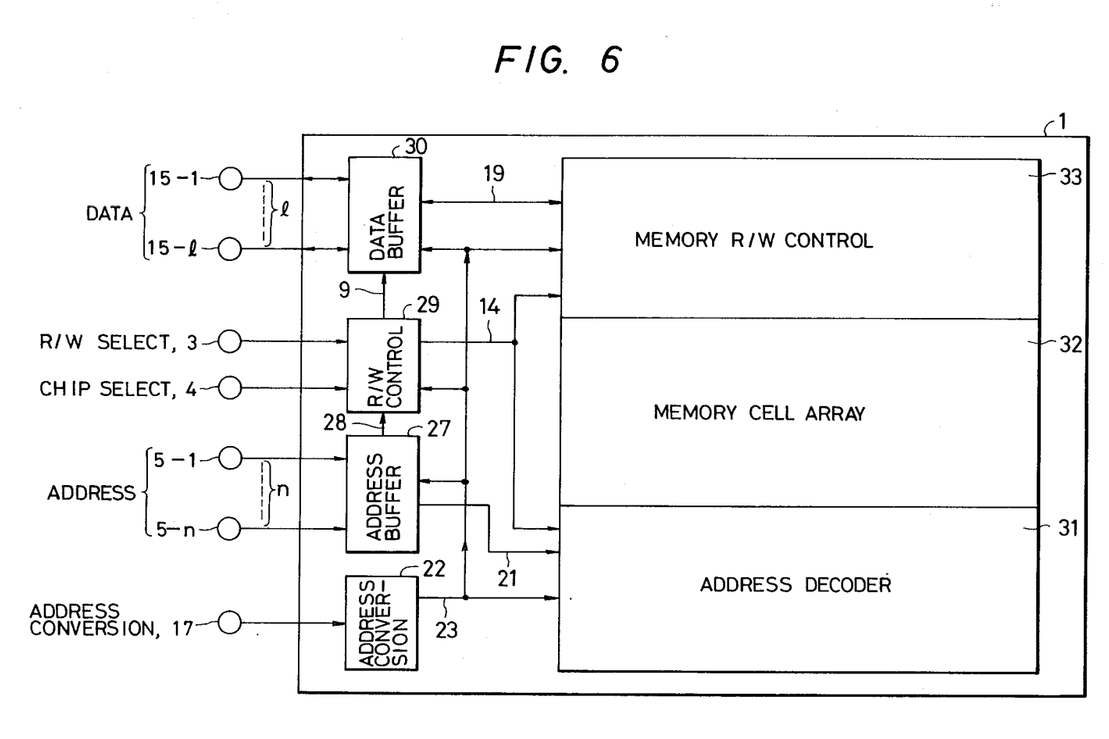
FIG. 6 shows another embodiment of the present invention.

FIG. 6 shows another embodiment of the present semiconductor memory device in which its circuit configuration takes the form of either, for example, a random access memory of $1 \times 2^n$ bits which has a single data input/output terminal or a random access memory of $(1 \times 2^n/1)$ bits which has l data input/output terminals. The configuration is determined according to the information from the address conversion instruction terminal 17, wherein an address decode signal of the address decoder circuit is varied according to the desired configuration.

For example, when a video RAM, having video picture elements composed at $1024 \times 512$ dots, is to be built, eight (8) separate $1 \times 64K$ bit DRAMs are necessary. In such case, raster scanning is usually performed horizontally for a line of 1024 bits and then a next line is scanned and so on.

The $1 \times 64K$ bit DRAMs are arranged along the scanning direction and a data bus is 8 bits wide, i.e., 1 byte. With such a memory construction, it may be easy to access the data successively and horizontally arranged on the video RAM. However, when data arranged successively vertically are to be accessed, only 1 bit can be processed for each access. In a case where the vertical access is desired for an improvement of processing speed, $8 \times 8K$ bit DRAMs arranged vertically are used instead of the horizontally arranged $1 \times 64K$ bit DRAMs. In the latter case, since each memory cell of the memory cell array must be accessed by different addresses, the operation of the address decoder circuit and the rest of the circuit must be changed by the address conversion control signal.

In FIG. 6, the semiconductor memory device 1 provides a $1 \times 2^n$ bit random access memory or a $(1 \times (2^n/1))$ bit random access memory according to the information from the address conversion instruction terminal 17 through the address conversion control circuit 22. The address buffer circuit 27 responds to addressing information from the address input terminals 5-1-5-n and the address conversion control signal 23 to provide $2^n$ different addresses on the internal address bus 21 composed of n signal lines when it has the $1 \times 2^n$ bits construction. Alternatively, when the array 32 has the $(1 \times 2^n/1)$ configuration, the address buffer circuit 27 provides a number $(n - \log_2 l)$ of address signals from the n signals on the address input terminals 5-1-5-n on the internal address bus 21. In the latter case the remaining $\log_2 l$ address input terminals are used as chip select terminals.

Some of the signals from the address input terminal 5-1-5-n used as chip select terminals provide $\log_2 l$ chip select outputs 28 which are derived from the address buffer circuit 27 and supplied to the R/W control circuit 29. In the case of the $1 \times 2^n$ bits construction, the R/W control circuit 29 responds to control data from the R/W select terminal 3 and the chip select terminal 4 to produce the R/W control signal 14 which is supplied to the memory R/W control circuit 33 and to the address decoder circuit 31 according to the address conversion control signal 23 from the address conversion control circuit 22. In the case of the $1 \times (2^n/1)$ bits construction, the R/W control circuit 29 responds to the chip select signals 28 derived from the addresses and the control information from the chip select terminal 4 to produce the R/W control signal 14 which is supplied to the memory R/W control circuit 33 and the address decoder circuit 31. At this time, the data buffer control signal 9 is also produced by the R/W control circuit 29, in response to the address conversion control signal 23, and is supplied to the data buffer circuit 30. The data buffer circuit 30 receives the data buffer control signal 9 and the address conversion control signal 23 to make only one of the data input/output terminals 15-1-15-n effective in the case of the $1 \times 2^n$ bit configuration. The data buffer circuit 30 performs a data transfer with respect to the memory R/W control circuit 33 and one of the data input/output terminals 15-1-15-n using only one line of the internal data bus 19. When the memory cell array 25 is configured as $1\times(2^n/l)$ bits, the data buffer circuit 30 makes all of the data input/output terminals 15-1-15-l effective and performs a data transfer with respect to the memory R/W control circuit 33 by means of all the l signal lines of the internal data bus 19.

The address decoder circuit 31, in the case of the $1\times 2^n$ bit construction, responds to the R/W control signal 14 and the address conversion control signal 23 to select one of the $2^n$ memory cells according to the information on the n address buses. Alternatively, in the $1\times(2^n/l)$ configuration, the address decoder circuit 31 simultaneously selects l memory cells. For instance in this latter case, the l data simultaneously accessed according to the notation proper to the $1\times 2^n$ bit configuration at addresses 0, 0+m, 0+2m, ..., 0+(l-1)x m are addressed at the same time. In the case of the $1 \times 2^n$ bit construction one bit of the memory cell array 32 is selected according to the output signal of the address decoder circuit 31 and, in the a case of the $1\times(2^n/l)$ bit construction, memory cells of l bits thereof are selected simultaneously.

The memory R/W control circuit 33 performs the data transfer through the internal data bus 19. The memory R/W control circuit 33 receives the address conversion control signal 23, the R/W control signal 14 and a signal (not shown) from the address decoder circuit 31 to control either a reading or a writing of the data in the selected one memory cell of the memory cell array 32 and to transfer the data between the cell and one of the data lines of the internal data bus 19 in the case of the $1\times 2^n$ bits construction or, alternatively in the case of the $1\times(2^n/l)$ bits construction, to control the reading or writing of the data in the selected l memory cells of the memory cell array 32 and to transfer the data between the cells and the l data lines of the internal data bus 19.

The portions of the address conversion control circuit 22 and the address decoder circuit 31 shown in FIG. 6, which are related to the address conversion will be described with reference to a specific example in which a video RAM is constructed with 8 RAMs each of 64K bits and in which there are 1024 dots in a horizontal direction and 512 dots in a vertical direction.

When it is desired to access the array horizontally, the 8 RAMs, each having 64K bits, together provide one byte and the access is performed with using one byte as a unit in an access. In this case, since the number of dots in one line is 1024 bits, a series of (1024/8=)128 addresses are required for storage of one horizontal line in each RAM. Farther, since 64K bits $\div 128=512$, the 8 RAMs provide 512 horizontal lines in the vertical direction.

Figure 7:
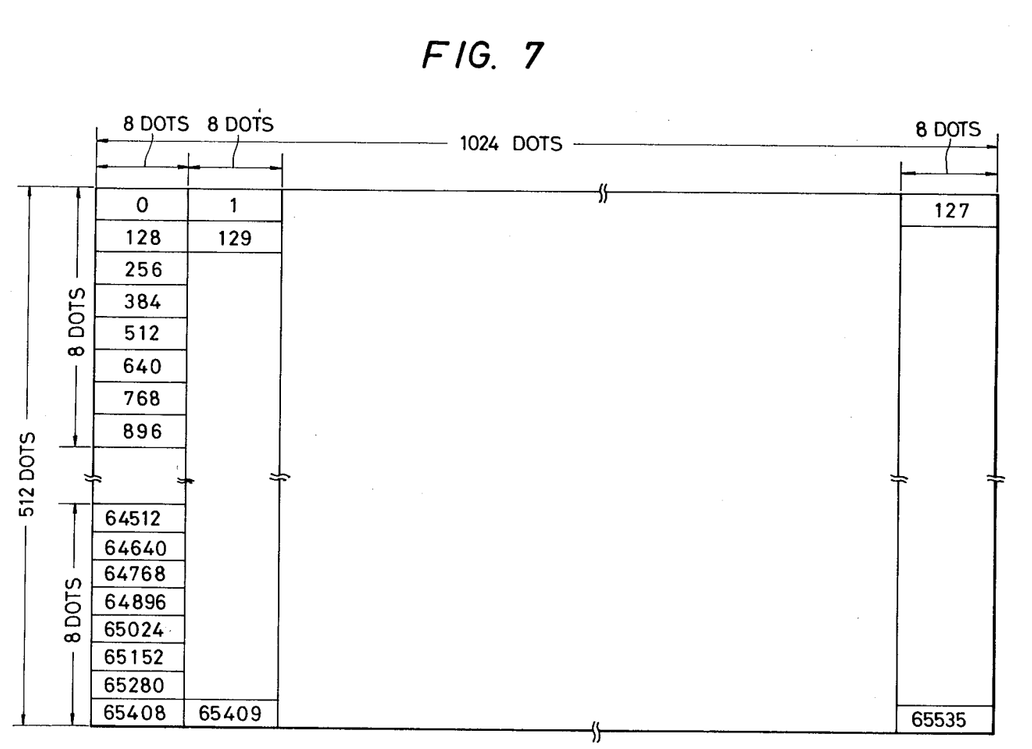
FIG. 7 shows an addressing structure for a video RAM to explain alternative address decoding in the embodiment of FIG. 6.

FIG. 7 shows an address map when the 8 RAMs are used as mentioned above. In FIG. 7, various numbers show addresses, each of which are common in the 8 RAMs. When the video RAM shown in FIG. 7 is accessed vertically, it is used as $8\times 8K$ bits RAM. Memory cells existing at the addresses, for example, 0, 128, 256, 384, 512, 640, 768 and 896 of the 64K bit RAM are read out in parallel as a memory unit having the address 0. Similarly, those existing at the address 64512, 64640, 64768, 64896, 65024, 65152, 65280 and 65408 are read out in parallel as a memory unit at the address 63. Since the memory cell corresponding to the address 64512 in the 64K bit construction has the address 64 in the case of the $8\times 8K$ bits RAM, two different addresses are assigned to the single memory cell.

Figure 8:
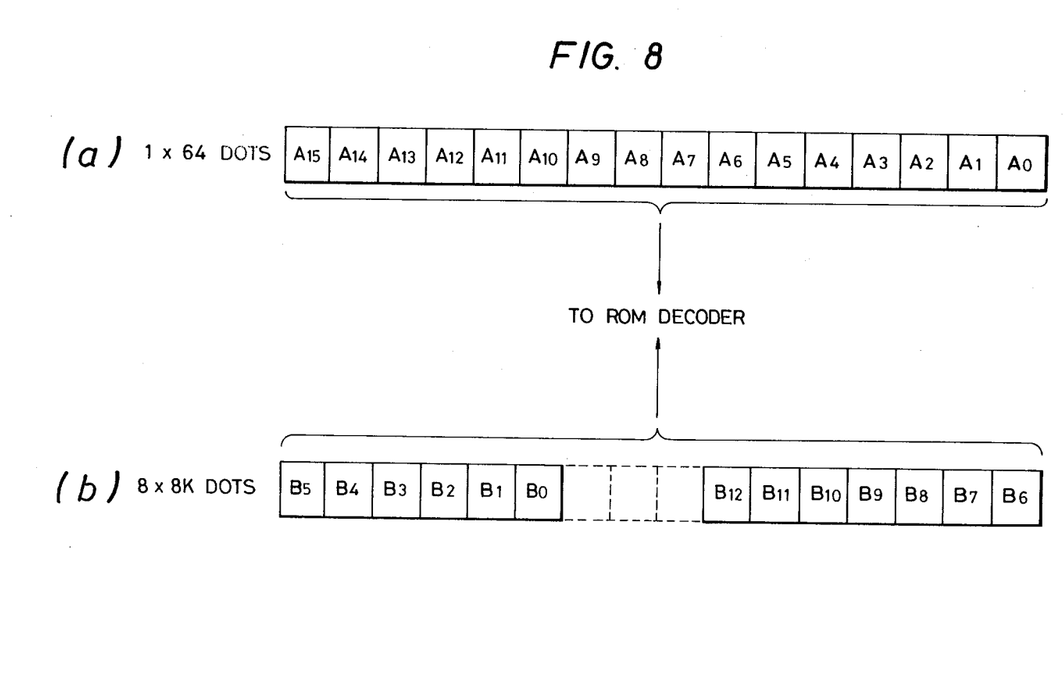
FIG. 8 shows a combination of address conversion when the address in FIG. 7 is accessed by vertical 8 parallel bits.

FIG. 8 shows an example of the ROM address decoders' address inputting method by which the above mentioned address conversion is realized, in which 16 address lines are depicted by $A_0, ..., A_{15}$ in the case of the 64K bit RAM configuration and 13 adder lines are depicted by $B_0, ... B_{12}$ in the case of the $8\times 8K$ bits RAM. In the case of the 64K bit RAM, one of the memory cells of the memory cell array is selected by a ROM address decoder which decodes an address of 16 bits from the address input lines $A_0$–$A_{15}$. On the other hand, in the case of the $8\times 8$ K bits RAM, the bits corresponding to the address lines $A_7$, $A_8$ and $A_9$ in the case of the 64K bit construction are made ineffective and the line corresponding to the $A_{10}$ is made to correspond to $B_0$. Similarly, the lines $B_1$, $B_2$, $B_3$, $B_4$, $B_5$, $B_6$, $B_7$, $B_8$, $B_9$, $B_{10}$, $B_{11}$ and $B_{12}$ are made to correspond to the address lines $A_{11}$, $A_{12}$, $A_{13}$, $A_{14}$, $A_{15}$, $A_0$, $A_1$, $A_2$, $A_3$, $A_4$, $A_5$ and $A_6$, respectively. Therefore, the address inputs of the ROM address decoder are supplied to the lines $B_0$–$B_{12}$. That is, the address input lines $B_0$–$B_{12}$ are the address inputs $A_0$–$A_{15}$ rearranged in proper order. This rearrangement can be realized by merely rearranging the connection of the address buses from the address buffer circuit.

Figure 9:
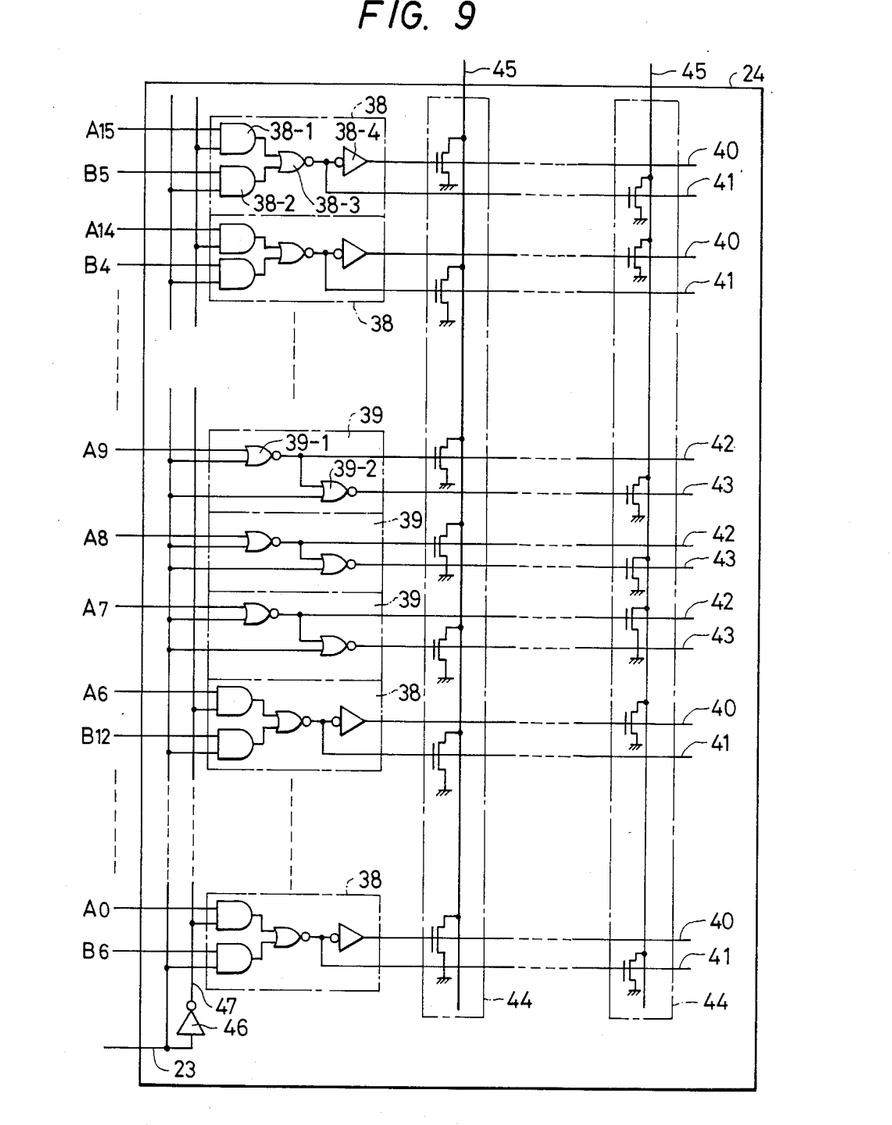
FIG. 9 is a circuit diagram of the address decoder of the embodiment in FIG. 6.

FIG. 9 shows a circuit diagram of the address decoder circuit 24 which performs the address conversion shown in FIGS. 7 and 8. In FIG. 9 the address decoder circuit 24 includes an inverter 46 which inverts the address conversion control signal 23 to produce an inverted address conversion control signal 47. Address multiplexers 38 are each responsive to the address conversion control signal 23 and the inverted address conversion control signal 47 to provide either the address input $A_i$ ($i=0$–15, except 7–9) or $B_k$ ($k=0$–12). Address conversion multiplexers 39 are each responsive to the address conversion control signal 23 and the inverted address conversion control signal 47 to determine whether or not the three address inputs $A_7$, $A_8$ and $A_9$ are effective and to provide an output signal indicative of the determination. Address decoder ROMs 44 are each responsive to the output signals from the address multiplexer 38 and the address conversion multiplexer 39 to decode the address and selectively activate a decoder output lines 45. Each of the address multiplexers 38 switches between the addresses inputs of each of the thirteen sets of the address inputs $A_{15}$, $B_5$; $A_4$, $B_4$;...; $A_{10}$, $B_0$; $A_6$, $B_{12}$; $A_0$, $B_6$ (FIG. 8) and provides an address multiplexer output 40 and that is inverted signal 41. That is, each of the address multiplexers 38 is composed of an AND gate 38-1 supplied with the address input Ai and the inverted address conversion control signal 47, an AND gate 38-2 supplied with the address input Bk and the address conversion control signal 23, a NOR gate 38-3 supplied with outputs of the AND gates 38-1 and 38-2 and an inverter (NOT gate) 38-4 supplied with an output of the NOR gate 38-3. The address multiplexer output 40 is derived from the inverter 38-4 and the inverted address multiplexer output 41 is derived from the NOR gate 38-3.

As shown in FIG. 9, when the address control signal 23 is "1", the address input of the B side is provided at the address multiplexer output 40 and the inverted address multiplexer 41 and, when the address conversion control signal 23 is "0", the address input of the A side is provided at the same outputs.

The address conversion multiplexer 39 is composed of a NOR gate 39-1 supplied with an address input Ax(x=7, 8, 9) and the address conversion control signal 23 and a NOR gate 39-2 supplied also with the latter signal and an output of the NOR gate 39-1. The multiplexer 39 provides a first address conversion multiplexer output 42 from the NOR gate 39-1 and a second address conversion multiplexer output 43 through the NOR gate 39-2. Therefore, as is clear from FIG. 9, when the address conversion control signal 23 is "1", the first and second address conversion multiplexer outputs 42 and 43 become "0", causing the address inputs $A_7$, $A_8$ and $A_9$ to be ineffective. When the address conversion control signal 23 is "0", mutually inverted A side address inputs are provided as they are at the address conversion multiplexer outputs 42 and 43. The address decoder ROMs 44 constitute a ROM address decoder and $2^n$ ROM address decoders are provided.

The address decoder ROM 44 is composed of parallel connected 16 enhancement FETs whose drains are connected commonly and sources are grounded. The common connection of the sources (or drains) is used as an output 45 of the address decoder ROM 44 at which "0" or "1" is provided according to the address input. Usually, the output 45 is precharged to "1" by a suitable circuit (not shown) when the address decoding is not performed.

Of the 16 FETs constituting the address decoder 44, there are 13 FETs which have gates to which are applied for address decoding either the address multiplexer outputs 40 or the inverted address multiplexer outputs 41. The remaining 3 FETs have gates to which are applied for address decoding the first or second address conversion multiplexer outputs 42 or 43. In this case, the 16 FETs must be arranged to decode all of the 16 address inputs. Therefore, when the address conversion control signal 23 is "0", which corresponds to the 16 address inputs $A_{15}$-$A_0$, only one of the address decoder ROMs 44 provides an active output, i.e., an address decoder ROM output 45 which is "1". Therefore, only one of the memory cells of the memory cell array is selected.

On the other hand, when the address conversion control signal 23 is "1", the first and second address multiplexer outputs 42 and 43 become "0" which correspond to the 13 address inputs and thus 8 of the address decoder ROM outputs 45 provide an output 45 which are "1". In this case, with the use of the combination of the address inputs supplied to the address multiplexing method as shown in FIG. 8, it becomes possible to vertically access 1 byte as shown in FIG. 7.

As described above, when either of the semiconductor memory devices shown in FIGS. 6 and 9 is used in a video RAM and also data processing speed is to be increased by accessing the video RAM vertically, the change is easily accomplished by changing the number of the data input/output terminals as well as the decoding system of the memory cells.

It should be noted that, although the present invention has been described as it applies to the video RAM, the invention is neither limited to such a video RAM nor to random access memory (RAM). It is possible to apply the present invention to semiconductor memory devices having any address decoder including a read only memory (ROM), or non-volatile memory or other types of memory.

Furthermore, although in the described embodiments the address conversion control signal is set by an external signal applied to the address conversion instruction terminal 17, it may be possible to store such a signal in a specific location in the semiconductor memory device and to produce the address conversion control signal internally on the basis of the stored signal.

Also the number of such address conversion control signal generation circuit may be arbitrary.

The address conversion combination may depend upon specific applications of the semiconductor memory device.

According to the present invention, the address by which a specific memory cell is selected can be converted in response to the address conversion control signal to have at least two different address for each memory cell and it is possible to access the memory at high speed by changing the data bit constitution and the construction of the memory cell array.

I claim:

1. A semiconductor memory device, comprising:
   first address signal generating means for generating a first address signal determining an address of a memory cell to which a data read/write operation is to be performed;
   at least one second address signal generating means responsive to said first address signal for performing a predetermined operation on said first address signal to produce a second address signal;
   address selection signal generating means for producing an address selection signal indicative of whether said first or second address signal is selected;
   address selection means responsive to said address selection signal for selectively passing either said first or said second address signal therethrough;
   memory cell selection means responsive to said first and second address signals passed through said address selection means for selecting a corresponding memory cell; and
   data read/write means for reading/writing said data from/to said memory cell selected by said memory cell selection means.

2. The semiconductor memory device as claimed in claim 1, wherein said first address signal generating means comprises an address and buffer circuit for passing an address signal supplied externally thereto.

3. The semiconductor memory device as claimed in claim 1, wherein said address selection signal generating means is responsive to a signal supplied externally of said semiconductor memory device.

4. The semiconductor memory device as claimed in claim 1, wherein said address selection signal generating means is responsive only to a signal provided within said semiconductor memory device.

5. The semiconductor memory device as claimed in any of claims 1 to 4, wherein said second address signal generating means and said address selection means operate upon a multiple-bit address and said address selection means is responsive to said address selection signal to shift the bits of said multiple-bit address by a predetermined number of places.

6. The semiconductor memory cell as claimed in any of claims 1 to 4, wherein said address selection means comprises multiplexer circuits each constituted with logical gates.

7. The semiconductor memory cell as claimed in claim 6, wherein said address selection means comprises multiplexer circuits each constituted with logical gates.

8. The semiconductor memory cell as claimed in any of claims 1 to 4, wherein said second address signal causes a selection of a plurality of memory cells simultaneously, wherein said data read/write means responds to said address selection signal for reading/writing said plurality of said memory cells in parallel when said address selection signal selectively passes said second address signal and reading/writing one bit of data to one of said memory cells selected by said first address signal when said address selection signal selectively passes said first address signal.

9. The semiconductor memory cell as claimed in claim 6, wherein said second address signal causes a selection of a plurality of memory cells simultaneously, wherein said data read/write means responds to said address selection signal for reading/writing said plurality of said memory cells in parallel when said address selection signal selectively passes said second address signal and reading/writing one bit of data to one of said memory cells selected by said first address signal when said address selection signal selectively passes said first address signal.

* * * * *